United States Patent [19]

Schachter et al.

[11] Patent Number: 4,696,828
[45] Date of Patent: Sep. 29, 1987

[54] PASSIVATION OF INP BY PLASMA DEPOSITED PHOSPHORUS

[75] Inventors: Rozalie Schachter, Flushing; Marcello Viscogliosi, North Tarrytown; Lewis A. Bunz, Peekskill; Diego J. Olego, Croton-on-Hudson; Harvey B. Serreze, Pound Ridge, all of N.Y.; Paul M. Raccah, Chicago, Ill.

[73] Assignee: Stauffer Chemical Company, Westport, Conn.

[21] Appl. No.: 736,750

[22] Filed: May 21, 1985

Related U.S. Application Data

[63] Continuation-in-part of Ser. No. 581,115, Feb. 17, 1984, abandoned.

[51] Int. Cl.$^4$ .............................................. B05D 3/06
[52] U.S. Cl. ...................................... 427/38; 427/299; 204/192.32
[58] Field of Search .............. 427/38, 299; 204/192 E, 204/192 EC Primary Examiner—Bernard D. Pianalto
Attorney, Agent, or Firm—F. Eugene Davis, IV; Mark P. Stone

[57] ABSTRACT

Pnictide thin films, particularly phosphorus, grown on III-V semiconductors, particularly InP, GaP, and GaAs, are amorphous and have a novel layer-like, puckered sheet-like local order. The thin films are typically 400 Angstroms thick and grown preferably by molecular beam deposition, although other processes such as vacuum evaporation, sputtering, chemical vapor deposition, and deposition from a liquid melt may be used. The layers are grown on the <100> <110>, and <111> surfaces of the III-V crystals. The pnictide layer reduces the density of surface states, and allows the depletion layer to be modulated, the surface barrier reduced, the electron concentration at the surface increased, and there is a decrease in the surface recombination velocity and an increase in the photoluminescence intensity. The layers may be utilized in MIS and Metalsemiconductor (Schottky) devices for example to insulate and passivate MISFETS, to passivate MESFETS, to reduce the surface current component of the reverse bias dark current in P-I-N and avalanche diodes, and to improve performance of opto-electronic devices such as light emitting diodes, lasers, solar cells, photo cathodes and photo detectors. The pnictide layer may be applied to intermetallic and compound semiconductors having a pnictide component. The pnictides may be phosphorus, arsenic, antimony or bismuth, or combinations thereof.

13 Claims, 15 Drawing Figures

COMPARISON OF INTENSITIES OF THE RAMAN SPECTRA OF GaAs WITH AND WITHOUT A P THIN FILM.

COMPARISON OF THE INTENSITIES OF THE PHOTOLUMINESCENCE OF GaAs WITH AND WITHOUT A P THIN FILM.

PASSIVATION OF INP BY PLASMA DEPOSITED PHOSPHORUS

The present application incorporates the entire disclosure of commonly owned, co-pending application Ser. No. 581,115 entitled "PASSIVATION AND INSULATION OF III-V DEVICES WITH PNICTIDES, PARTICULARLY AMORPHOUS PNICTIDES HAVING A LAYER-LIKE STRUCTURE", filed on Feb. 17, 1984. The disclosure of this co-pending application is repeated as follows and this application is a continuation-in-part of Ser. No. 581,115, filed on Feb. 17, 1984, abandoned.

RELATED APPLICATIONS

This application is related to the following co-pending applications, assigned to the same assignee as this application. These applications are incorporated herein by reference. U.S. patent application entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; MONOCLINIC PHOSPHORUS FORMED FROM VAPOR IN THE PRESENCE OF AN ALKALI METAL, Ser. No. 419,537, filed Sept. 17, 1982; CATENATED PHOSPHORUS MATERIALS, THEIR PREPARATION AND USE, AND SEMICONDUCTOR AND OTHER DEVICES EMPLOYING THEM, Ser. No. 442,208, filed Nov. 16, 1982, which is a Continuation-in-Part of Ser. Nos. 335,706 and 419,537; VACUUM EVAPORATED FILMS OF CATENATED PHOSPHORUS MATERIAL, Ser. No. 509,159, filed June 29, 1983; GRAPHITE INTERCALATED ALKALI METAL VAPOR SOURCES, Ser. No. 509,157, filed Jun. 29, 1983; SPUTTERED SEMICONDUCTING FILMS OF CATENATED PHOSPHORUS MATERIAL AND DEVICES FORMED THEREFROM, Ser. No. 509,175, filed Jun. 29, 1983; MIS DEVICES EMPLOYING ELEMENTAL PNICTIDE OR POLYPHOSPHIDE INSULATING LAYERS, Ser. No. 509,210, Jun. 29, 1983; and, LIQUID PHASE GROWTH OF CRYSTALLINE POLYPHOSPHIDE, Ser. No. 509,158, filed Jun. 29, 1983; also, the applications filed herewith of David G. Brock and John A. Baumann for THERMAL CRACKERS FOR FORMING PNICTIDE FILMS IN HIGH VACUUM PROCESSES; Diego J. Olego for PNICTIDE BARRIERS IN QUANTUM WELL DEVICES; Diego J. Olego for USE OF PNICTIDE FILMS FOR WAVE-GUIDING IN OPTO-ELECTRONIC DEVICES; Rozalie Schachter and Marcello Viscogliosi for VACUUM DEPOSITION PROCESSES EMPLOYING A CONTINUOUS PNICTIDE DELIVERY SYSTEM, PARTICULARLY SPUTTERING; Mark A. Kuck and Susan W. Gersten for CONTINUOUS PNICTIDE SOURCE AND DELIVERY SYSTEM FOR FILM DEPOSITION, PARTICULARLY BY CHEMICAL VAPOR DEPOSITION; Mark A. Kuck and Susan W. Gersten for METHOD OF PREPARING HIGH PURITY WHITE PHOSPHORUS; Robert Parry, John A. Baumann and Rozalie Schachter for PNICTIDE TRAP FOR VACUUM SYSTEMS; and, Mark A. Kuck, Susan W. Gersten, John A. Baumann and Paul M. Raccah for HIGH VACUUM DEPOSITION PROCESSES EMPLOYING A CONTINUOUS PNICTIDE DELIVERY SYSTEM.

TECHNICAL FIELD

This application relates to the passivation and insulation of III-V devices with pnictides, particularly amorphous pnictides having a layer-like puckered sheet-like structure; compound, intermetallic semiconductors, particularly III-V semiconductors; to pnictide and polypnictides, particularly phosphorus and polyphosphides; to MIS and metal-semiconductor (Schottky) devices, particularly MISFETS and MESFETS; to light absorbing diodes, particularly P-I-N and avalanche detector diodes, solar cells, and photo cathodes; and to light emitting diodes, and lasers.

BACKGROUND ART

III-V semiconductors have desirable properties of higher carrier mobility than silicon. They have been successfully employed in metal semiconductor (Schottky) devices, but have not been commercially employed in the more widely useful metal-insulator-semiconductor (MIS) devices. A reason for this is that the native oxides of the III-V materials do not form thermodynamically stable layers thereon in the way that silicon dioxide layers can be formed on silicon to form MIS devices. Silicon oxynitride and $Si_3N_4$ have been used as an insulating layer on III-V materials with limited success.

The passivation of III-V semiconductors has been a problem for the same reasons.

Thus it is highly desirable to find a material, and a means of producing it, which readily forms an insulating and passivating layer on III-V materials and thus provide the basis for the formation of MIS and Schottky devices, particularly MISFETS and MESFETS.

Similarly, it is desirable to reduce the surface component of currents in III-V opto-electronic devices by passivating the surface thereof.

It is also desirable to dezrease the carrier recombination velocity at the surface of III-V opto-electronic devices.

DISCLOSURE OF THE INVENTION

We have discovered that insulating, passivating and surface recombination velocity reducing pnictide rich layers can be formed on III-V semiconductor substrates by various methods that pnictide rich layers may be formed on any substrate. These include vacuum co-evaporation, sputtering, chemical vapor deposition, two-source vapor transport, deposition from a liquid melt and molecular beam deposition which produces the best results.

In particular, we have deposited an alkali metal polyphosphide layer, namely $KP_{15}$, on gallium arsenide, and gallium phosphide, indium phosphide and Si. We have also deposited insulating and passivating layers of x alkali metal polyphosphides having the formula $MP_x$ where x is greater than 15 on these materials. For all practical purposes, such very high x materials are elemental phosphorus.

We have also deposited elemental phosphorus layers on substrates of gallium arsenide, gallium phosphide and indium phosphide using these same processes. We fully expect that other III-V semiconductors may also be used as substrates.

We contemplate that other high pnictide polypnictides, particularly alkali metal polypnictides and other elemental pnictides comprising Group V atoms will also form useful insulating layers and semiconductors comprising a pnictide. These pnictide materials are insulators or very high resistivity semiconductors, good film formers, and the pnictides, being group V materials, provide chemical continuity, matching order, and adhesion to the group V atoms of the group V containing semiconductors.

The insulating layers of our invention have a resistivity of greater than $10^{+10}$ ohm-cm. Which is greater than the resistivity of the III-V materials.

We have successfully added another $Si_3N_4$ layer on top of a pnictide layer of III-V materials to provide a higher breakdown voltage.

The amorphous layers we employ have a local order not found before in amorphous pnictide films deposited on a III-V substrate. This is a layer-like puckered sheet-like structure similar to black phosphorus. This structure apparently forms at low effective energies at the surface during the deposition. Thus, in vacuum evaporation and molecular beam deposition when the surface is kept below approximately 200° C. this new layer-like puckered sheet amorphous polyphosphide material forms. Similarly, at low energies and at temperatures below approximately 300° C. the same material forms in a sputterer. The material is formed by deposition from excess phosphorus supplied as $P_4$ vapor, which is cracked to $P_2$ vapor by a heated cracker in the case of vacuum deposition and molecular beam deposition and is cracked by the plasma in a sputterer.

The surface layers according to our invention reduce the density of surface states, allows modulation of the depletion layer, reduce the surface barrier, increase the surface electron concentration, and increase the photoluminescence intensity and decrease the surface carrier recombination velocity.

The pnictide layers according to the invention may be used to insulate and passivate MIS and Schottky devices, particularly MISFETS and MESFETS, to reduce the surface current between different layers in III-V devices such as the dark current in reverse biased light detecting diodes, particularly P-I-N and avalanche diodes, and to increase the efficiency of light emitting and light collecting optoelectronic devices, particularly solar cells, photocathodes, light emitting diodes, lasers, and photo detectors.

OBJECTS OF THE INVENTION

It is therefore an object of the invention to provide insulating layers for semiconductors comprising pnictides.

Another object of the invention is to provide passivating layers for semiconductors comprising pnictides.

A further object of the invention is to provide a new form of amorphous pnictides.

Still another object of the invention is to provide improved MIS and Schottky devices, including MISFETS and MESFETS.

A still further object of the invention is to provide improved opto-electronic devices, including light emitting and light collecting devices such as P-I-N and avalanche diodes, solar cells, photocathodes, light emitting diodes and lasers.

The invention accordingly comprises the several steps and the relation of one or more of such steps with respect to each of the others, and the articles possessing the features, properties, and the relation of elements, which are exemplified in the following detailed disclosure. The scope of the invention is indicated in the claims.

BRIEF DESCRIPTION OF THE DRAWINGS

For a fuller understanding of the nature and objects of the invention reference should be made to the following detailed description taken in connection with the accompanying drawings in which.

The same reference characters refer to the same elements throughout the several views of the drawings.

BEST MODE FOR CARRYING OUT THE INVENTION

We have found that pnictides films grown at relatively low temperatures, below 300° C. at low powers in sputtering and below 200° C. in vacuum evaporation and molecular beam deposition, have a puckered sheet-like, layer-like, structure similar to black phosphorus. These amorphous films are deposited from phosphorus in the form of $P_4$ vapor which is cracked by the plasma in sputtering and by a heated cracker in vacuum evaporation and molecular beam deposition.

Reference should be had to the above-identified copending applications VACUUM DEPOSITIONS PROCESSES EMPLOYING PNICTIDE BUBBLER, PARTUCULARLY SPUTTERING, HIGH VACUUM DEPOSITION PROCESSES EMPLOYING PNICTIDE BUBBLER, and THERMAL CRACKERS FOR FORMING PNICTIDE FILMS IN HIGH VACUUM PROCESSES, for a fuller understanding of these processes.

We have found that pure phosphorus films, and presumably films of other pure pnictides, form the best insulation and passivating layers on III-V materials. This is because the pnictide layer is capable of matching the pnictides within the III-V semiconductors. Polypnictides, particularly $MP_x$ where M is an alkali metal and x ranges from 15 to infinity may also be used. We believe that our insulating and passivating films may be used on any compound or intermetallic semiconductor comprising a pnictide. We have deposited such films on the <111>, <100> and <110> of various III-V semiconductors.

The best results to date have been with phosphorus films having a typical thickness of approximately 400 Å deposited on III-V semiconductors solely from a phosphorus source by molecular beam deposition.

Figure 1:
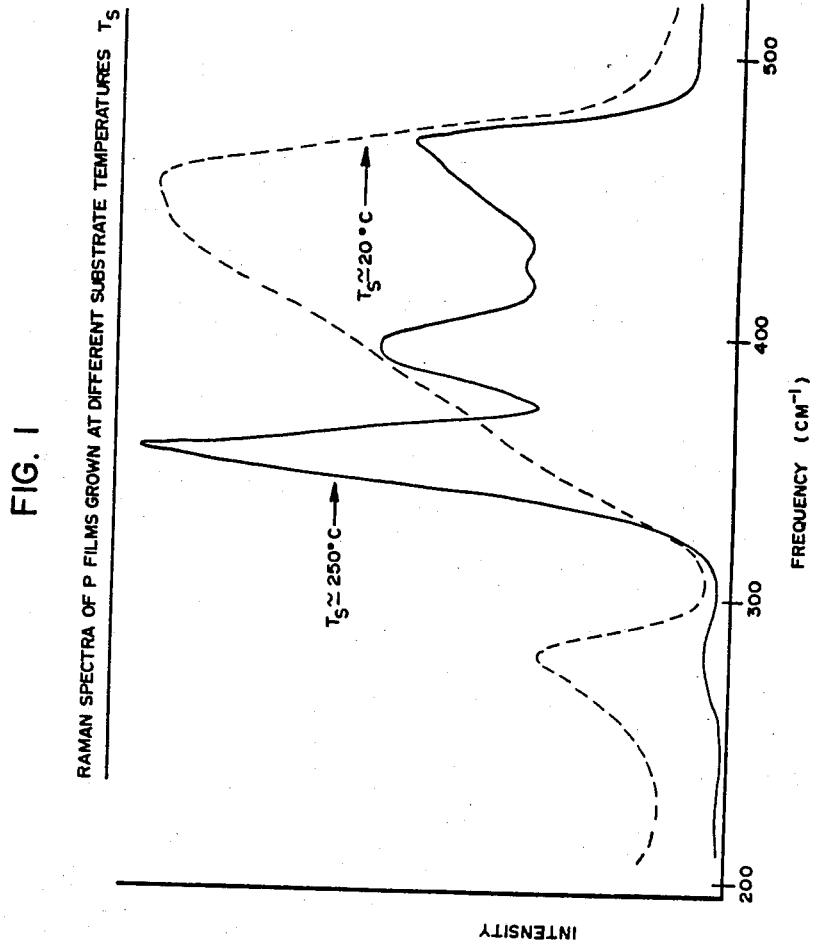
FIG. 1 is a plot Raman spectra of films grown at different substrate temperatures.

FIG. 1 is a comparison of the Raman spectra of polyphosphide films grown by vacuum evaporation (250° C.) and molecular beam deposition (20° C.). The solid line spectrum, when the substrate is at 250° C., is typical spectrum similar to amorphous red phosphorus indicating a local order comprising parallel pentagonal tubes. The dotted line spectrum of the film formed at approximately 20° C. indicates a much different local order. Films produced by sputtering at temperatures less than that or equal to approximately 300° C. have the same Raman spectra as the 20° C. molecular beam deposition results shown in FIG. 1.

Figure 2:
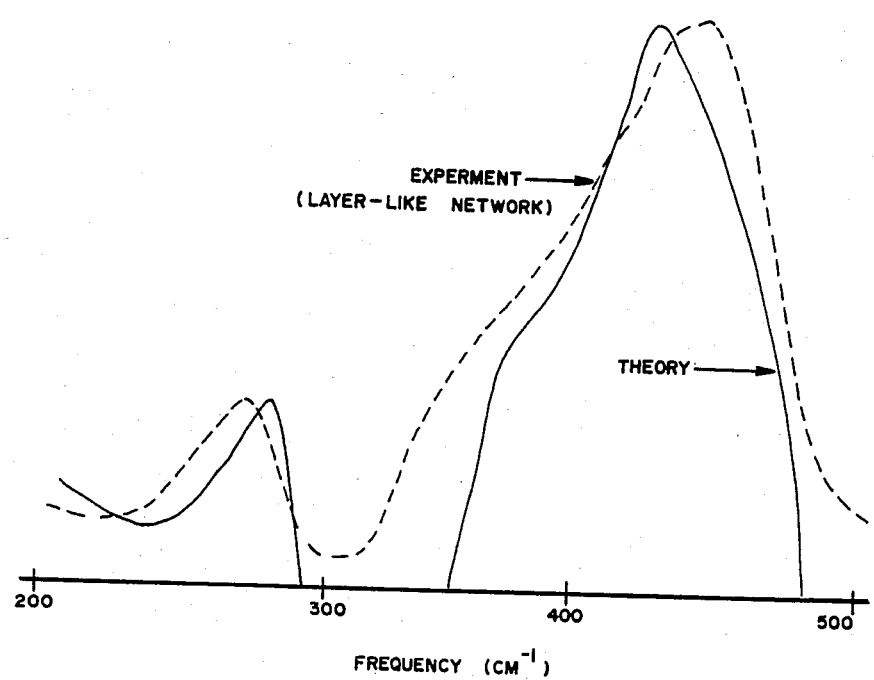
FIG. 2 is a comparison of the Raman spectra of the film grown at low temperature with the theoretical prediction for a puckered sheet layer-like structure.

FIG. 2 is a comparison of the Raman spectrum of film grown at a substrate temperature of 20° C., shown in dotted lines, with a theoretical prediction of the spectrum of a puckered sheet-like, layer-like, structure simliar to black phosphorus.

We conclude that the local order of these films is the amorphous counterpart of the puckered layer-like, sheet-like, crystalline structure of black phosphorus.

This local order is simpler than that of the films described in the above-identified previously filed copending applications which have a local order comprising pentagonal tubes. We have found that the energy band gap of this new form of amorphous phosphorus according to our invention is approximately 1.7 eV versus a bandgap of approximately 2.0 eV for amorphous red phosphorus. We have not detected any photoconductivity or photoluminescence from phosphorus films of this type. The films are shiny, hard and stable.

We concluded that these films would be good candidates for insulating and passivating layers for III-V materials.

Results of Electrical Measurements of Phosphorus Thin Films Grown On Indium Phosphide and Galium Arsenide Amorphous thin films of phosphorus of a typical thickness of 400 Å have been grown by molecular beam deposition on the <100> surface of InP and the <100> surface of GaAs, the substrates being maintained at room temperature, approximately 23° C.

The InP is specified by the manufacturer to contain $2 \times 10^{15}$ free electrons per cubic centimeter; the gallium arsenide to contain $2 \times 10^{16}$ free electrons per cubic centimeter.

Figure 3:
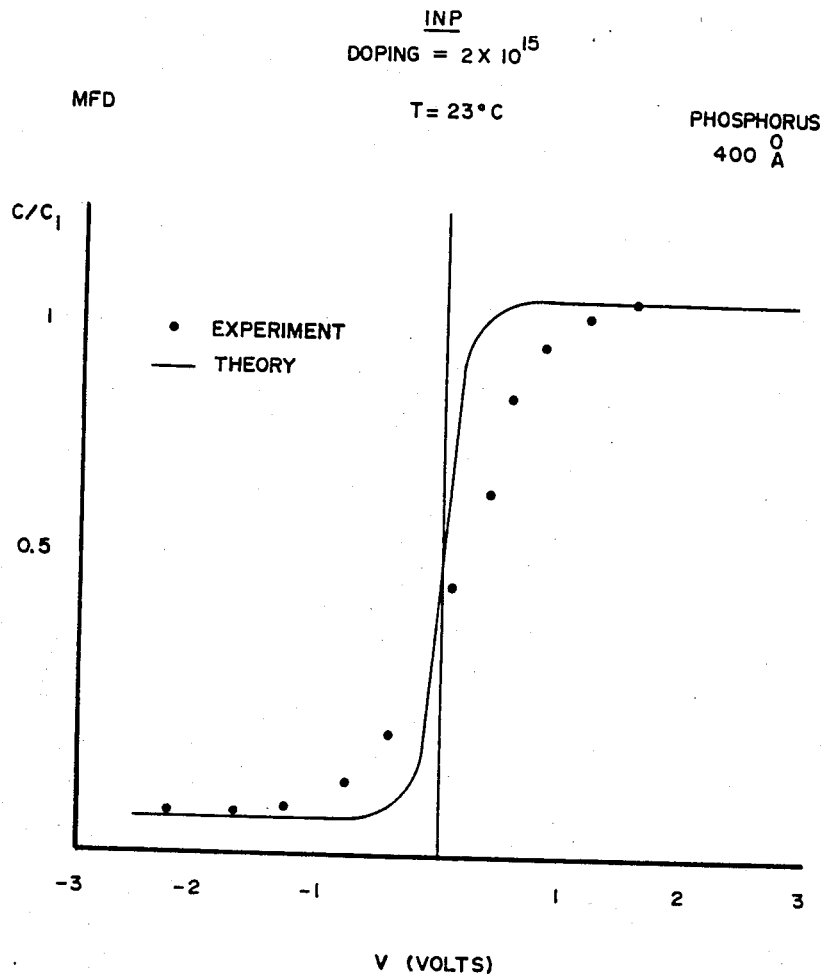
FIG. 3 is a plot of normalized capacitance versus voltage for indium phosphide having a insulating layer thereon according to the present invention.

FIG. 3 is a comparison of the theoretical (solid line) and experimental (dotted line) data plots of normalized capacitance versus voltage for an MIS structure on InP. The solid line (theoretical) curve is computed for the case of ideal conditions, namely a perfect insulation and a negligibly small density of surface states.

Excellent agreement between experiment and theory is shown in these high frequency C-V curves. This indicates that a low density of surface states has been achieved by the phosphorus layer on the InP and that the phosphorus layer allows modulation of the depletion layer.

Figure 4:
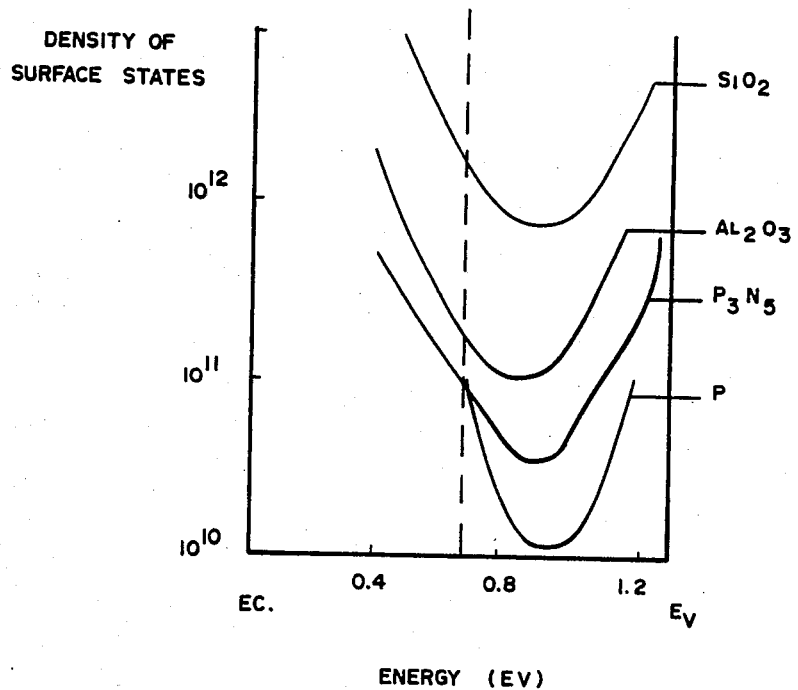
FIG. 4 is a plot of the density of surface states versus energy for various possible insulating and passivating layers on indium phosphide according to the present invention.

The density of the surface states can be calculated by Terman's method. FIG. 4 is a comparison of the density of surface states for passivation with $SiO_2$, $Al_2O_3$, $P_3N_5$, and P (our phosphorus layer) and it can be seen that we have achieved the lowest density of surface states reported on III-V materials.

$E_C$ in FIG. 4 is the energy of the conduction band and $E_V$ is the energy of the valence band.

Figure 5:
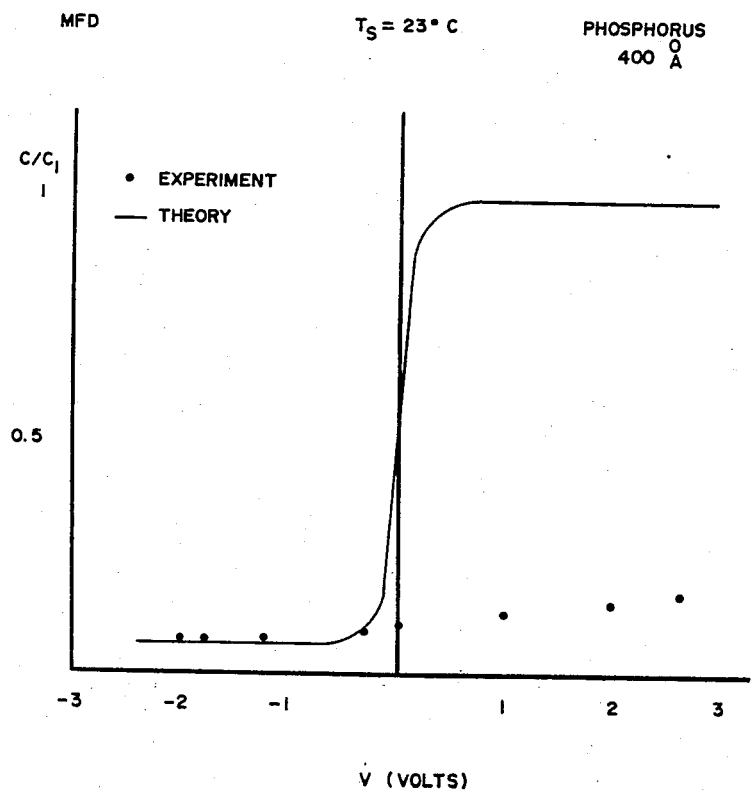
FIG. 5 is a plot of normalized capacitance versus voltage for gallium arsenide having a layer deposited thereon according to the present invention.

FIG. 5 is such a comparison for GaAs. It will be seen that the depletion layer has been modulated but that the density of surface states has not been reduced as much as in the case of InP.

Passivation Studies of Phosphorus Layers on GaAs

Figure 6:
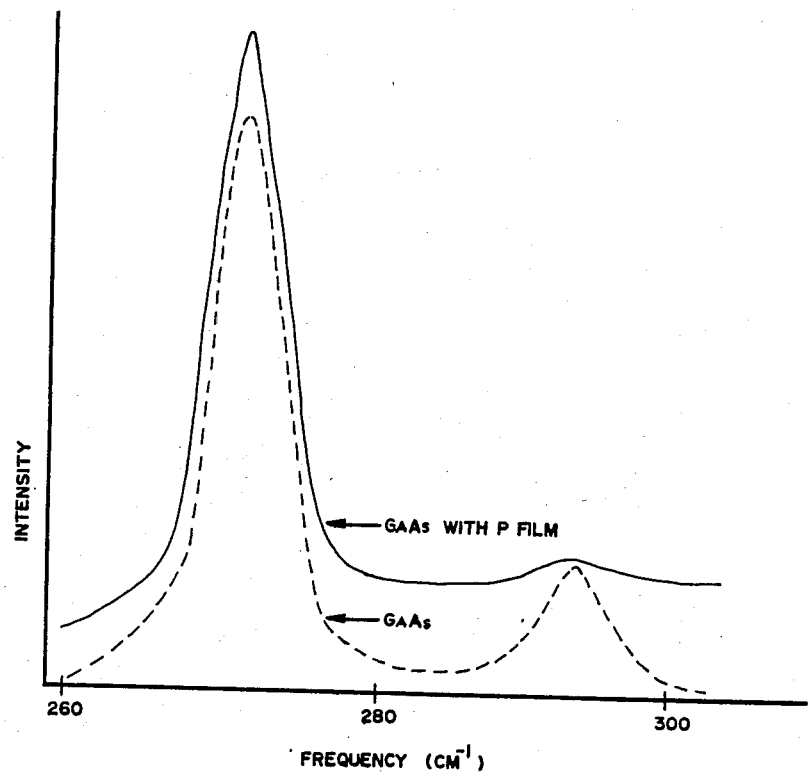
FIG. 6 is a comparison of the intensities of the Raman spectra of gallium arsenide with and without a film according to the present invention deposited thereon.

FIG. 6 is a comparison of the intensities of the Raman spectra of GaAs with and without our phosphorus thin film layer. That of the plain GaAs is shown by dotted line and GaAs, that having our phosphorus film, is shown by the solid line.

These data suggests a reduction of the surface barrier of the GaAs when the phosphorus barrier is present. This indicates that the phosphorus layer can be used in MIS and Schottky devices and for the improvement of the performance of opto-electronic devices.

Figure 7:
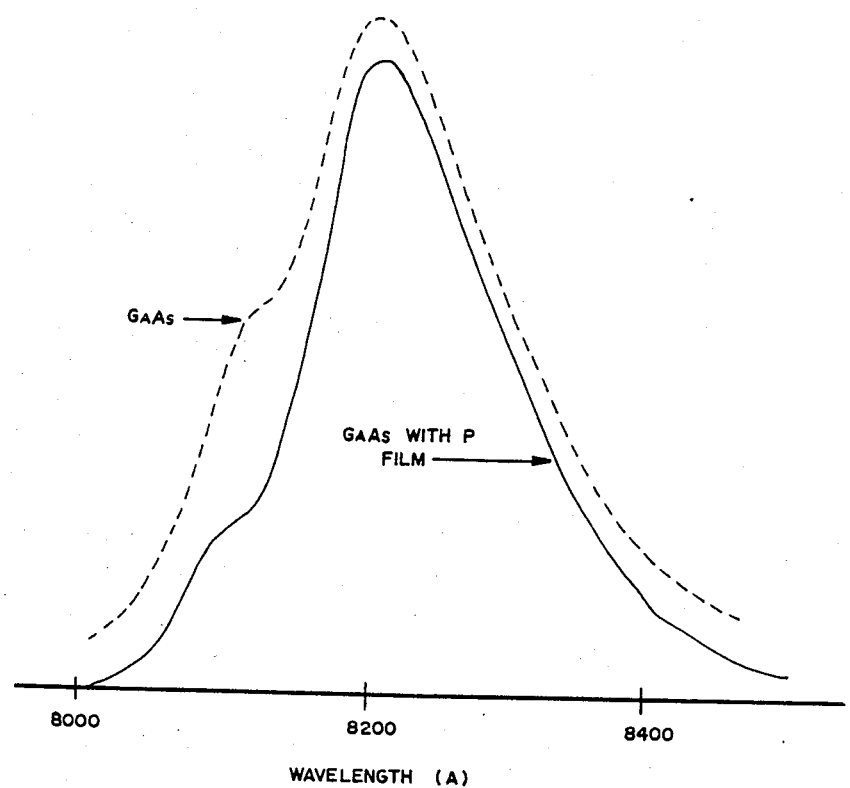
FIG. 7 is a comparison of the line shape of the photoluminescence of gallium arsenide with and without a film according to the present invention deposited thereon.

FIG. 7 is a comparison of the line shape of the photoluminescence of GaAs with and without a phosphorus thin film; GaAs alone is shown dotted; GaAs with our phosphorus in solid.

It can be concluded from this diagram that there is an increase of the electron concentration at the surface of the GaAs when a phosphorus thin film is present. Since this behavior is expected if the surface barrier has decreased, this is consistent with the results shown in FIG. 6.

Figure 8:
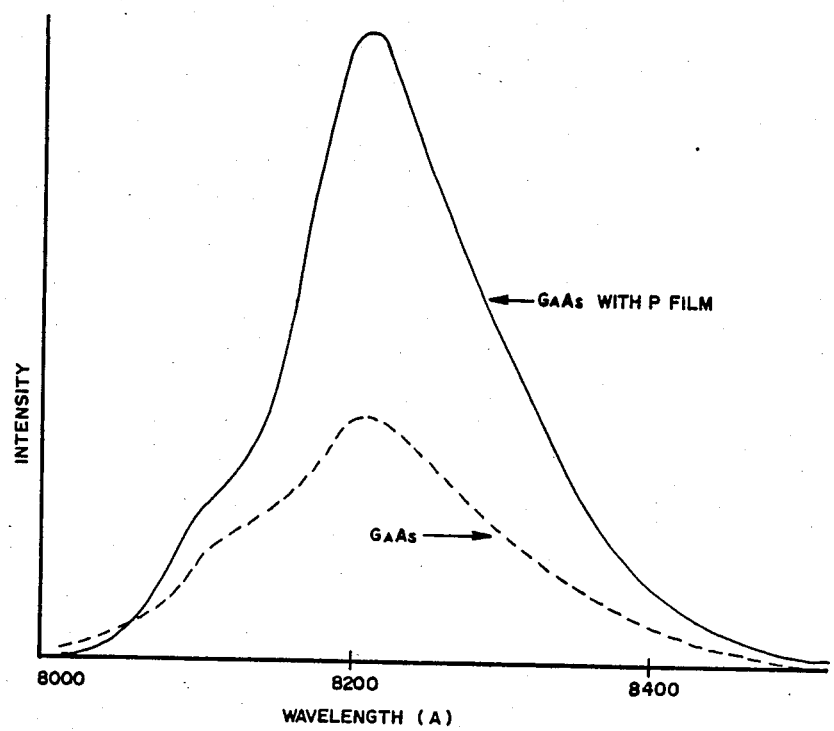
FIG. 8 is a comparison of the intensities of the photoluminescence of gallium arsenide with and without a film according to the present invention deposited thereon.

FIG. 8 shows that there is an increase in the intensity of the photoluminescence produced from GaAs when phosphorus thin film is present. The photoluminescence intensity of GaAs alone is shown by the dotted line and intensity with the phosphorus film is shown by the solid line.

This increase in photoluminescence again indicates a decrease in number of surface states when the phosphorus thin film is present. This result is consistent with FIGS. 6 and 7.

The phosphorus film of FIGS. 6, 7, and 8 was grown on the <111> surface of GaAs specified by the manufacturer to have $7 \times 10^{17}$ free electrons per cubic centimeter.

We conclude that the GaAs surface barrier has been reduced when a phosphorus thin film having a layer-like, puckered sheet-like local order is deposited on the GaAs. Our experiments indicate a reduction of one order of magnitude in the density of the surface states.

The increase of the photoluminescence intensity we have noted is extremely important for opto-electronic devices. It means that there is a decrease in the surface recombination velocity.

Thus we have shown that a polypnictide surface film having a layer-like, puckered sheet-like local order deposited upon III-V semiconductors produces a reduction in the density of surface states, allows the modulation of the depletion layer; reduces the surface barrier, increases the free electron concentration at the surface, increases the photoluminescence intensity, and decreases the surface recombination velocity.

Devices According To The Invention

Figure 9:
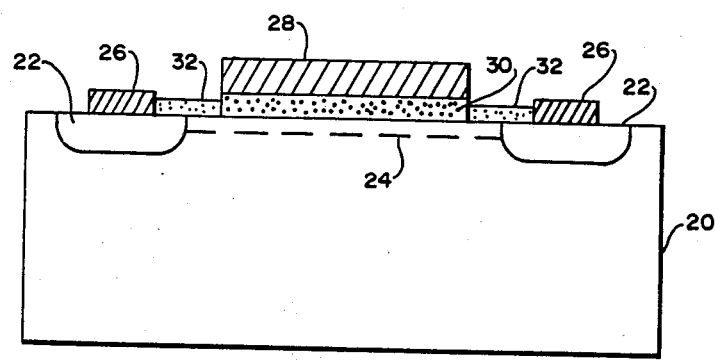
FIG. 9 is a diagrammatic cross section of a MISFET according to the present invention.

Now referring to FIG. 9, a MISFET according to the invention comprises a body of III-V semiconducting material 20, islands 22 of high conductivity, a conduction channel 24 therebetween, source and drain metal contacts 26 gate metal contact 28, insulating layer 30 and passivating layers 32.

According to the invention the I layer 30 and the passivating layers 32 which may be unitary and deposited on the substrate 20 at the same time, are the new amorphous layer-like phosphorus or other layer-like pnictide-rich materials, such as $MP_{15}$ where M is an alkali metal and $MP_x$ where M is an alkali metal and x varies from 15 to infinity, particularly where the alkali metal is potassium.

Figure 10:
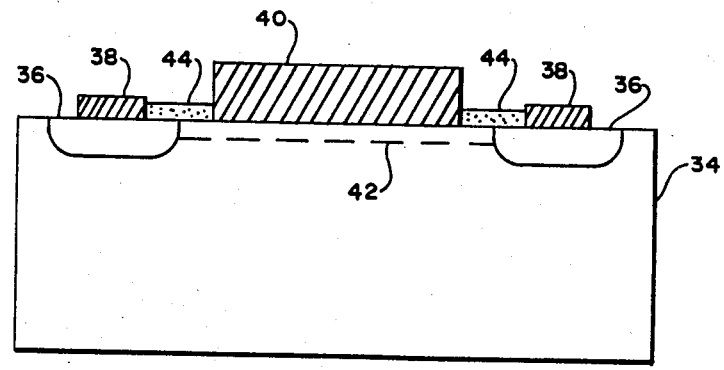
FIG. 10 is a diagrammatic cross section of a MESFET according to the present invention.

FIG. 10 shows a MESFET according to the invention. This comprises a III-V semiconductor body 34, islands 36 of high conductivity, source and drain contacts 38, gate contact 40, conduction channel 42 and passivating layers 44 according to the invention. The layers 44 reduce the surface currents from the source and the drain to the gate.

Figure 11:
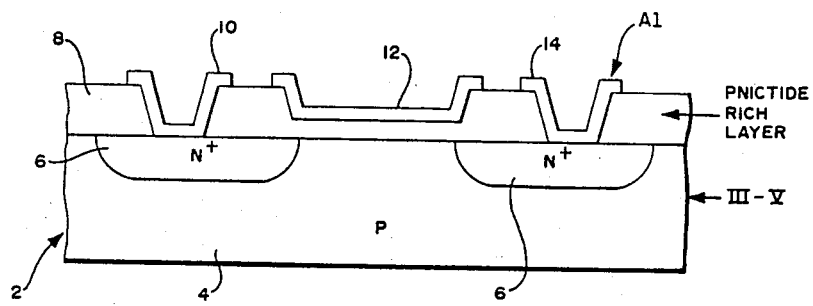
FIG. 11 is a diagrammatic cross section of a MISFET according to the present invention.

According to our invention another MIS device utilizing a III-V substrate may be formed as shown in FIG. 11. There the III-V substrate, generally indicated at 2, is appropriately doped to form P regions 4 and N regions 6 therein. The polypnictide or elemental pnictide layer 8 is then deposited thereon, according to our invention, appropriately masked and etched, and then a metal such as aluminum is deposited to form drain 10, gate 12, and source 14. Those skilled in the art will realize that many other MIS configurations and devices may be fabricated using a pnictide-rich insulating layer according to our invention.

Most III-V semiconductor junction devices have either a planar or mesa configuration where the edges of the junction or junctions are exposed on the device surface. For some critical applications (e.g., PIN or avalanche photo detector diodes for lightwave communications), it is imperative that the dark current (i.e., current with no illumination) under operating reverse bias be as low as possible in order to assure low device noise. Since the surface current component of this dark current can be significant, it is desirable to minimize the surface current through "passivation" of the surface (i.e., reduction or elimination of surface current paths). This is done by depositing a thin film of a suitable insulating material onto the exposed device surface. Materials currently used for this on III-V devices include $SiO_2$, $Si_3N_4$, polyimide, and photoresist, but none are able to controllably and reproducibly reduce the surface current to the very low values needed.

According to our invention we use a thin film of polypnictide material (e.g., phosphorus, $MP_{15}$, or $MP_x$ where x is 15 or greater and where M is an alkali metal such as potassium) for III-V devices of this type. These materials have: (1) good physical and chemical stability, (2) high electrical resistivity, and (3) a preferred tendency or "affinity" for the polypnictides to grow on III-V material substrates.

Figure 12:
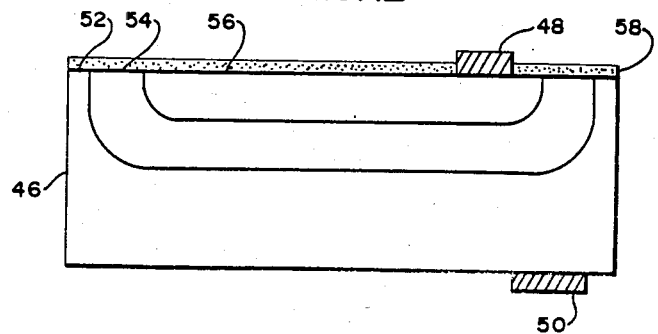
FIG. 12 is a diagrammatic cross section of a photo detecting diode according to the present invention.

Now referring to FIG. 12, a body of III-V semiconductor material 46 containing various layers has metal contacts 48 and 50 deposited thereon. To reduce the surface current component which would provide leakage between the layers 52, 54 and 56 we deposit a film 58 of pnictide according to our invention.

The device illustrated in FIG. 12 may be, for example, a P-I-N photo detecting diode or an avalanche diode.

Figure 13:
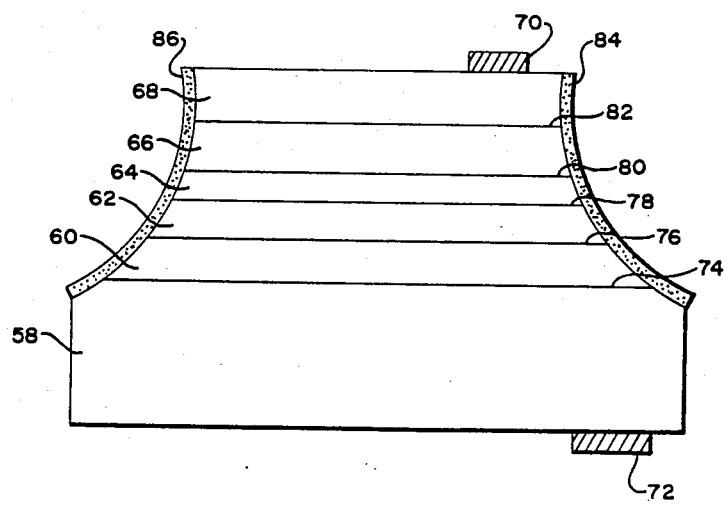
FIG. 13 is a diagrammatic cross section of another photo detecting diode according to the present invention.

The device illustrated in FIG. 12 has a planar structure. A device having a mesa structure is shown in FIG. 13. It comprises various layers 58, 60, 62, 64, 66, and 68 of III-V material and metal contacts 70 and 72. Again, in order to prevent surface currents across the interfaces 74, 76, 78, 80, and 82 between the layers 58, 60, 62, 64, 66, and 68, we provide pnictide-rich passivating layers 84 and 86.

The device illustrated in FIG. 13 may be for example a photo detecting P-I-N diode or an avalanche doide.

Both FIGS. 12 and 13 illustrate the use of our novel pnictide layers to lower surface currents in opto-electronic devices.

Another important application of our invention to opto-electronic devices is based on the fact that our novel pnictide layers reduce the surface recombination velocity at the surfaces of III-V semiconductors to which they are applied. We have noted an increase by a factor of 2.5 in the measured photoluminescence intensity of heavily doped GaAs with an amorphous thin film of layer-like puckered sheet-like phosphorus grown on the <111> surface. This increase in the photoluminescence intensity indicates a decrease recombination velocity at the surface. It is known that the smaller the surface recombination velocity the better the performance of the opto-electronic devices such as light emitting diodes, lasers, solar cells, photo cathodes and photo detectors utilizing III-V semiconductors.

According to our invention the layer of our new layer-like form of pnictide-rich material would be applied to the light emitting or light collecting surface of the optoelectronic device.

Figure 14:
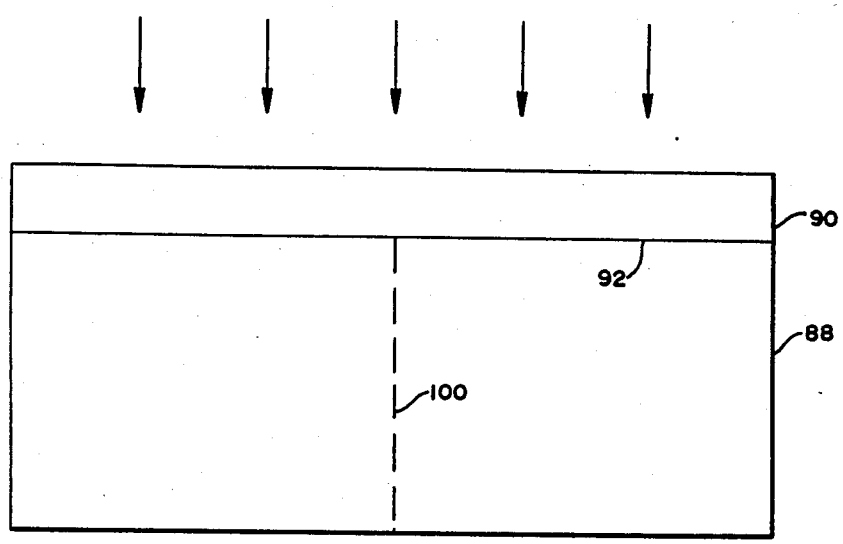
FIG. 14 is a diagrammatic cross section of a light collecting device according to the present invention.

Thus referring to FIG. 14, a light collecting device according to our invention comprises a body 88 of a compound intermetallic or III-V semiconductor comprising a pnictide and a pnictide-rich layer 90 deposited on the light collecting surface 92 thereof.

Figure 15:
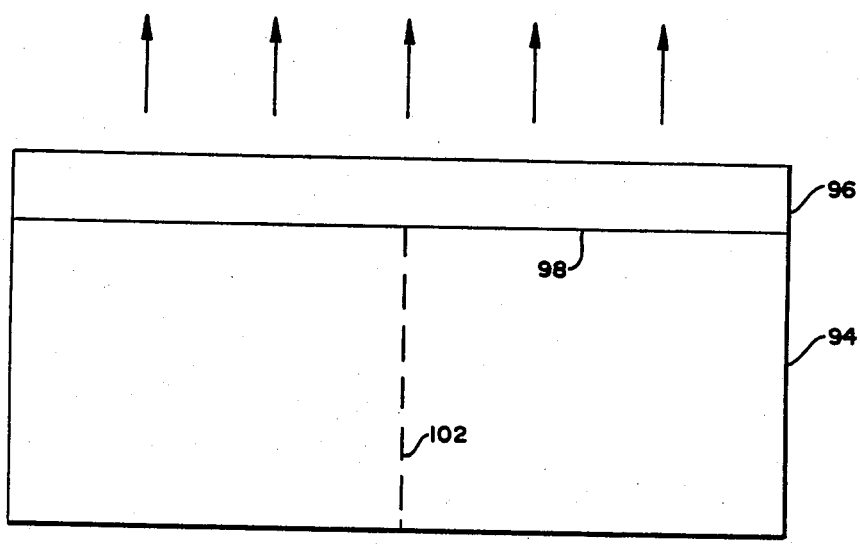
FIG. 15 is a diagrammatic cross section of a light emitting device according to the present invention.

Similarly, as illustrated in FIG. 15, a light emitting device according to our invention again comprises a body 94 of a compound intermetallic semiconductor comprising a pnictide-rich layer 96 deposited on the light emitting surface 98 thereof. If the light collecting or light emitting device has two or more semiconductor layers which emerge on the surfaces 92 or 98 as indicated by the intersections between them 100 and 102, then the layers 90 and 96 also reduce surface currents. The layers 90 and 96 may also be used to reduce surface currents between contacts, not shown, as in the devices of FIGS. 9 through 13.

Thus we have disclosed the insulation and passivation of compound and intermetallic semiconductors comprising a pnictide, particularly III-V semiconductors; disclosed a new form of pnictide-rich thin films having a layer-like, puckered sheet-like local order; we have shown that such layers when deposited on pnictide based semiconductors reduce the density of surface states, allows modulation of the depletion layer, decrease the surface barrier, increase the carrier concentration at the surface, increase the photoluminescence, and decrease the carrier recombination velocity at the surface; we have disclosed MIS and Schottky devices, particularly MISFETS and MESFETS utilizing pnictide rich layers for insulation and passivation; we have disclosed various electro-optical devices utilizing such layers for insulation, passivation, increased performance and lifetime.

The semiconductors utilized in our invention comprising pnictides are commonly called intermetallic or compound. III-V semiconductors which are compound, intermetallic, semiconductors comprising elements from column III and column V of the periodic table such as the binary semiconductor aluminum phosphide, aluminum arsenide, aluminum antimonide, gallium phosphide, gallium arsenide, gallium antimonide, indium phosphide, indium arsenide and indium antimonide, the ternary and the quaternary semiconductors. By pnictide we mean those elements from column V of the periodic table, namely nitrogen, phosphorus, arsenic, antimony and bismuth.

It will thus be seen that the objects set forth above, among those made apparent from the preceding description, are efficiently obtained and, since certain changes may be made in carrying out the above methods and in the articles set forth without departing from the scope of the invention, it is intended that all matter contained in the above description or shown in the accompanying drawing, shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Particularly, it is to be understood that in the claims ingredients or compounds recited in the singular are intended to include compatible mixtures of such ingredients wherever the sense permits.

The following material is original to the present application:

We report that an amorphous phosphorus (P) film, deposited at room temperature from a $P_4 + AR$ mixture in an Rf plasma, reduces the density of surface states, $N_{ss}$, near the conduction band of InP. We further investigated the effects of chemical and plasma surface treatment on the distribution of states in the InP gap. The value of $N_{ss}$, determined from capacitance-voltage measurements of MIS diodes, is approximately $10^{12}/cm^2 eV$ over a wide dynamic range for surfaces treated with $HIO_3$ or Hydrazine. Hysteresis is associated with a remnant oxide at the interface, as monitored by ESCA. A 5 min. sputter etching (50-100 eV) leads to an oxygen free interface but shows an increase of $N_{ss}$ due to the destruction of the crystalline surface as determined by Raman and photoluminescence. The sign of the threshold voltage of similarly treated MISFET devices changes from positive to negative as the device performance deteriorates. We interpret our results in terms of a movement of the Fermi level at the P-InP interface. We conclude that the combination of a P layer and an optimized surface treatment can provide the passivation of InP required for opto-electronic devices.

Having described our invention what we claim as new and desire to secure by letters patent is:

1. A method of reducing the density of surface states of InP near the conduction band comprising depositing an amorphorous phosphorous film thereon in an RF plasma.

2. A method of depositing an amorphous phosphorus film on an InP surface, comprising the steps of treating the surface of InP with a material chosen from the group consisting of $HIO_3$ and Hydrazine, and depositing an amorphous phosphorus film on the treated surface.

3. The method of claim 2 further comprising the step of sputter etching said treated surface of said InP to provide an oxygen free interface before said deposition step.

4. The method of claim 3 wherein said sputter etching step is conducted for approximately five minutes.

5. The method of claim 4 wherein said deposition step is carried out in an RF plasma.

6. The method of claim 3 wherein said sputter etching step is conducted in the range of 50-100 eV.

7. The method of claim 6 wherein said deposition step is carried out in an RF plasma.

8. The method of claim 3 wherein the density of surface states of InP is increased.

9. The method of claim 3 wherein said method results in the movement of the Fermi level at the P-InP interface.

10. The method of claim 3 wherein said method provides passivation of InP required for optoelectronic devices.

11. The method of claim 3 wherein said deposition step is carried out in an RF plasma.

12. The method of claim 2 wherein said method provides passivation of InP required for optoelectronic devices.

13. The method of claim 2 wherein said deposition step is carried out in an RF plasma.

* * * * *